(12) United States Patent
Iwahori

(10) Patent No.: US 10,600,612 B2
(45) Date of Patent: Mar. 24, 2020

(54) CHARGED PARTICLE BEAM APPARATUS

(71) Applicant: HITACHI HIGH-TECH SCIENCE CORPORATION, Minato-ku, Tokyo (JP)

(72) Inventor: Toshiyuki Iwahori, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 30 days.

(21) Appl. No.: 15/936,140

(22) Filed: Mar. 26, 2018

(65) Prior Publication Data

US 2018/0277333 A1    Sep. 27, 2018

(30) Foreign Application Priority Data

Mar. 27, 2017    (JP) .................. 2017-060905

(51) Int. Cl.
| | |
|---|---|
| *H01J 37/09* | (2006.01) |
| *H01J 37/08* | (2006.01) |
| *H01J 37/20* | (2006.01) |
| H01J 37/26 | (2006.01) |

(52) U.S. Cl.
CPC .............. *H01J 37/09* (2013.01); *H01J 37/08* (2013.01); *H01J 37/20* (2013.01); *H01J 37/26* (2013.01); *H01J 2237/0213* (2013.01); *H01J 2237/0458* (2013.01); *H01J 2237/04756* (2013.01); *H01J 2237/202* (2013.01); *H01J 2237/20207* (2013.01); *H01J 2237/28* (2013.01); *H01J 2237/31749* (2013.01)

(58) Field of Classification Search
CPC ....................................................... H01J 37/09
See application file for complete search history.

(56) References Cited

U.S. PATENT DOCUMENTS

| | | | | |
|---|---|---|---|---|
| 2007/0235646 A1* | 10/2007 | Tanii | .................. | G01N 23/2251 250/311 |
| 2011/0006209 A1* | 1/2011 | Yoshikawa | ........... | H01J 37/023 250/310 |

FOREIGN PATENT DOCUMENTS

| | | |
|---|---|---|
| JP | 2000311646 | 11/2000 |

\* cited by examiner

*Primary Examiner* — Eliza W Osenbaugh-Stewart
(74) *Attorney, Agent, or Firm* — Adams & Wilks

(57) ABSTRACT

A charged particle beam apparatus includes a sample chamber; a sample stage; an electron beam column irradiating a sample S using an electron beam; and a focused ion beam column irradiating the sample S using a focused ion beam. The apparatus includes an electrode member displaceable between an insertion position between a beam emitting end portion of the electron beam column and the sample stage and a withdrawal position distant from the insertion position, the electrode member being provided with an electrode penetrating hole passing the electron beam therethrough. The apparatus includes a driving unit displacing the electrode member; a power source applying a negative voltage to the electrode member; and an insulation member electrically insulating the sample chamber the driving unit from the electrode member.

7 Claims, 7 Drawing Sheets

CHARGED PARTICLE BEAM APPARATUS

CROSS REFERENCE TO RELATED APPLICATION(S)

This application claims the benefit of Japanese Patent Application No. 2017-060905, filed Mar. 27, 2017, which is hereby incorporated by reference in its entirety into this application.

BACKGROUND OF THE INVENTION

Technical Field

The present invention relates generally to a charged particle beam apparatus.

Description of the Related Art

Conventionally, a scanning electron beam apparatus that includes an electrode between a beam emitting surface of an objective lens and a sample and applies a negative voltage to enable the sample and the electrode to have the same electric potential so as to decelerate an electron beam incident on the sample is well known (referring to, e.g., Patent Document 1).

DOCUMENT OF RELATED ART (Patent Document 1) Japanese Patent Application Publication No. 2000-311646

SUMMARY OF THE INVENTION

The scanning electron beam apparatus according to the conventional technology uses a retarding method of forming an electric field decelerating an electron beam around a sample such that high-resolution is maintained and electron beam damage of the sample is suppressed, whereby observation of a surface structure of the sample may be realized in a low acceleration voltage region. A negative voltage is applied to an electrode (a retarding electrode) placed on an optical axis of the electron beam, such that, for example, unevenness of an electric field caused by flatness and form of the sample can be suppressed, compared to the case where a negative voltage is directly applied to the sample due to omission of the retarding electrode.

However, in the scanning electron beam apparatus according to conventional technology, a range of an appropriate observation region is limited by the retarding electrode, and thus it is necessary to perform relative alignment of a sample part, which is an observation target, and the retarding electrode with high accuracy. However, when the retarding electrode is fixed to the objective lens, etc., alignment with high accuracy may be difficult.

Accordingly, the present invention has been made keeping in mind the above problems occurring in the related art, and an object of the present invention is to provide a charged particle beam apparatus being capable of easily performing appropriate and high-accuracy alignment of a sample and an electrode for decelerating an electron beam incident on the sample.

(1) According to an aspect of the present invention, a charged particle beam apparatus includes: a sample stage on which a sample is placed; a sample chamber receiving the sample stage therein; a charged particle beam column irradiating the sample with a charged particle beam; an electrode member provided to be displaceable between an insertion position, the insertion position being between a beam emitting end portion of the charged particle beam column and the sample stage and a withdrawal position distant from the insertion position, the electrode member being provided with a penetrating hole through which the charged particle beam passes at the insertion position; a driving means displacing the electrode member; a power source applying negative voltage to the electrode member from outside the sample chamber to decelerate the charged particle beam with respect to the sample; and an electrical insulation member electrically insulating the sample chamber and the driving means from the electrode member.

(2) Also, according to an aspect of the present invention, in the charged particle beam apparatus described in (1), the driving means may include an actuator displacing the electrode member in a shift direction parallel to an optical axis of the charged particle beam column.

(3) Also, according to an aspect of the present invention, in the charged particle beam apparatus described in (1), the driving means may include an actuator displacing the electrode member within a range that does not interfere with a tilt of the sample plate.

(4) Also, according to an aspect of the present invention, in the charged particle beam apparatus described in any one of (1) to (3), an inner surface of the penetrating hole may be formed in a shape of a convex surface that is smoothly continuous to a surface of the electrode member.

(5) Also, according to an aspect of the present invention, in the charged particle beam apparatus described in any one of (1) to (4), the power source may apply the negative voltage to the electrode member and the sample such that the electrode member and the sample have a same electric potential.

(6) Also, according to an aspect of the present invention, in the charged particle beam apparatus described in (5), the apparatus may further include: a first end being in contact with the sample; a second end provided at a position distant from the sample; and an electrical connection member electrically connecting the first end and the second end, wherein the power source applies the negative voltage to the second end and the electrode member.

(7) Also, according to an aspect of the present invention, in the charged particle beam apparatus described in any one of (1) to (6), the charged particle beam column may include an electron beam column irradiating the sample with an electron beam, and a focused ion beam column irradiating the sample with a focused ion beam.

According to the charged particle beam apparatus of the present invention, the electrode member is displaced between the insertion position and the withdrawal position and receives a negative voltage to decelerate the charged particle beam for the sample, and thus appropriate and high-accuracy alignment of the electrode member and the sample may be easily performed by driving of the electrode member by the driving means.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a charged particle beam apparatus according to an embodiment of the present invention will be described with reference to the accompanying drawings.

Figure 1:
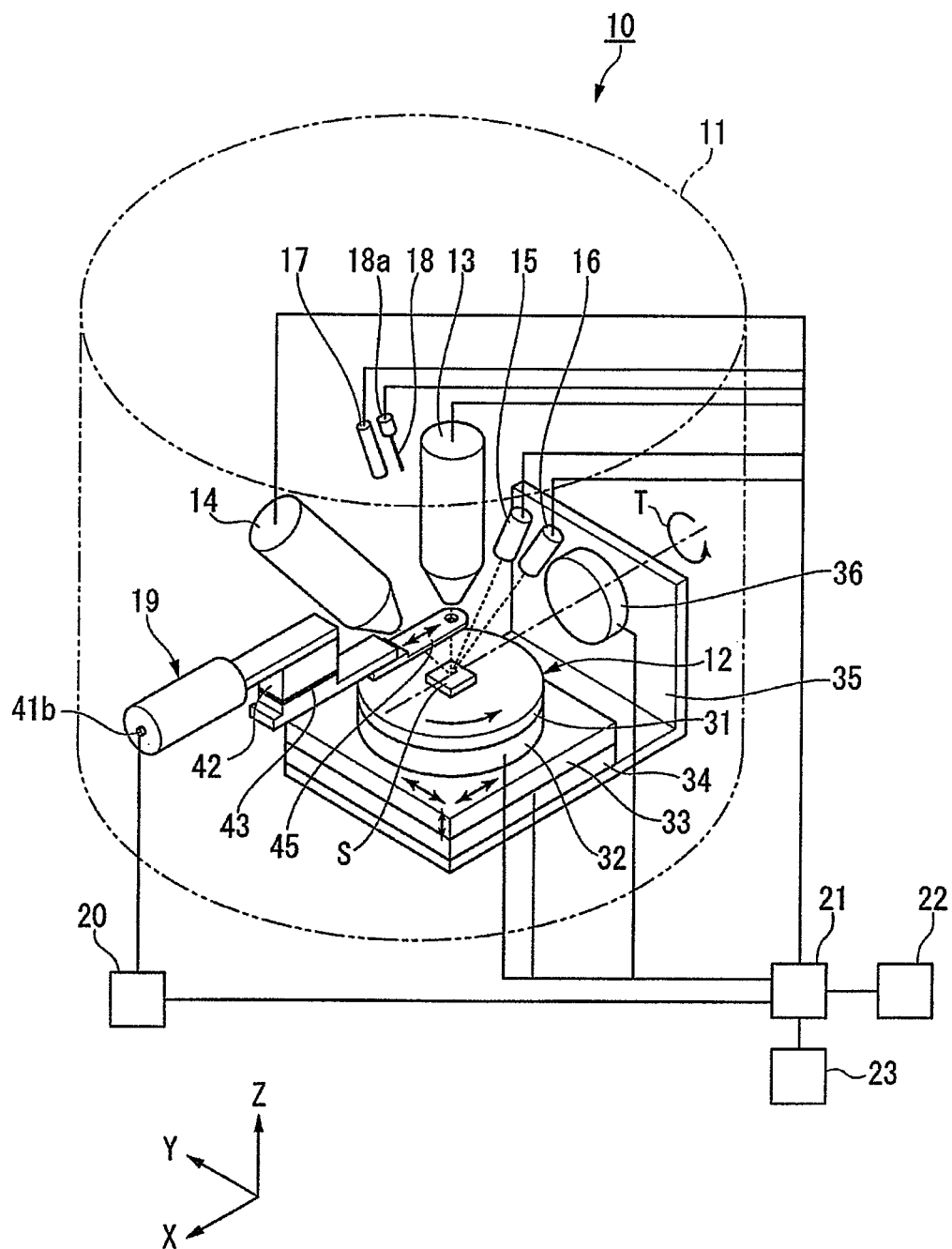
FIG. 1 is a perspective view illustrating schematic configurations of a charged particle beam apparatus according to an embodiment of the present invention.
Figure 2:
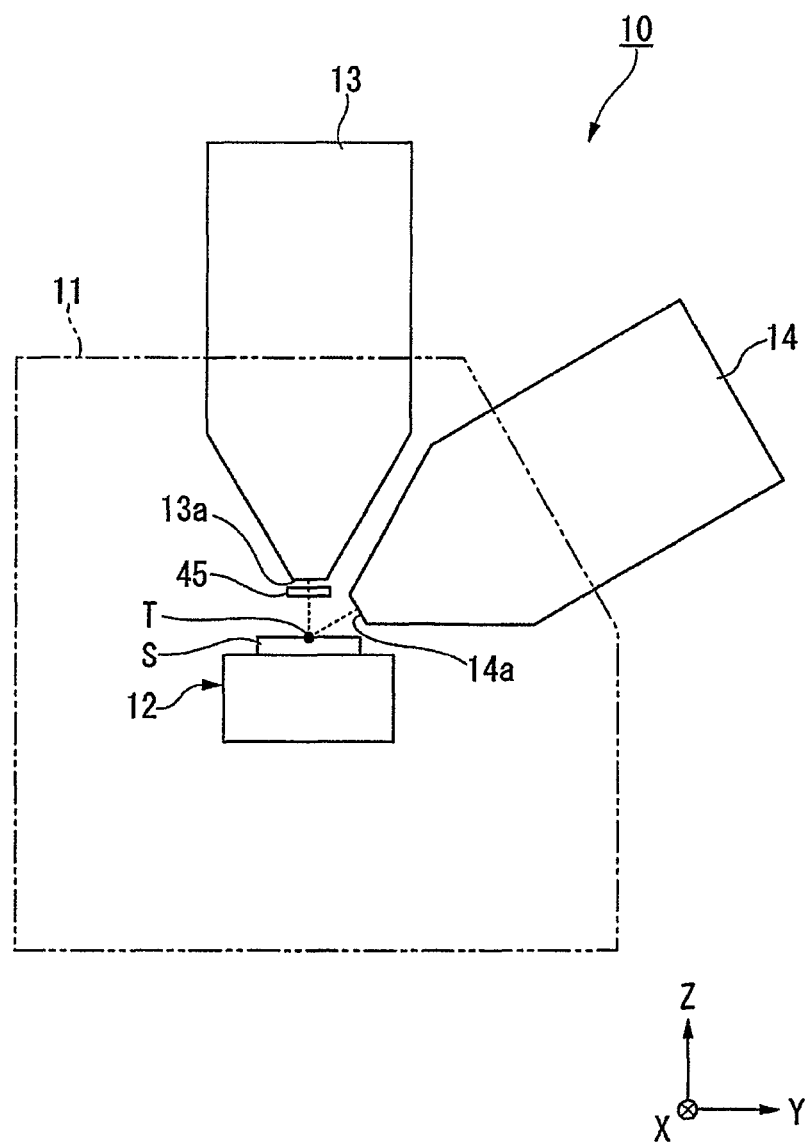
FIG. 2 is a side view illustrating schematic configurations of a part of a charged particle beam apparatus according to an embodiment of the present invention.
Figure 3:
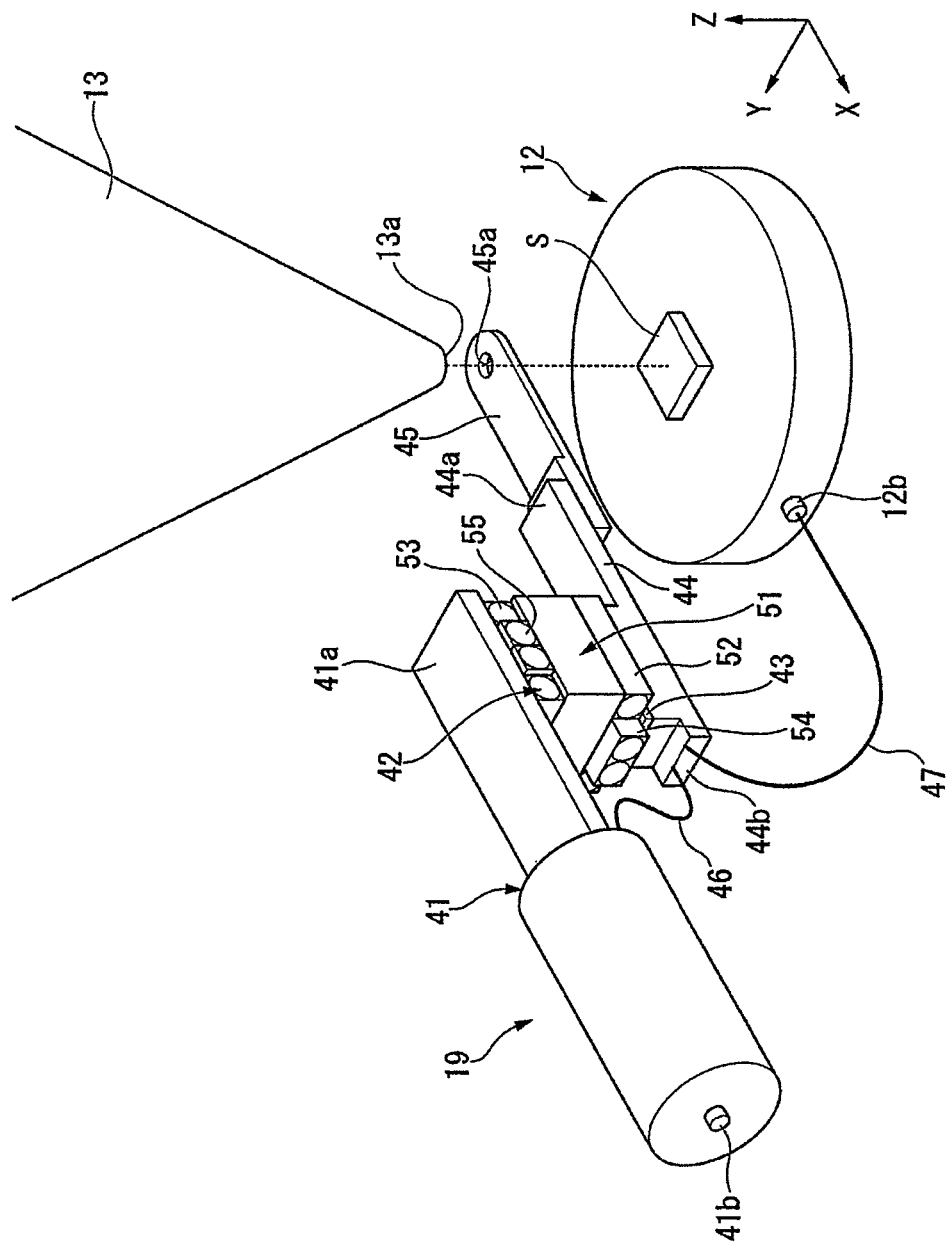
FIG. 3 is an enlarged perspective view illustrating an electrode driving unit of a charged particle beam apparatus according to an embodiment of the present invention.
Figure 4:
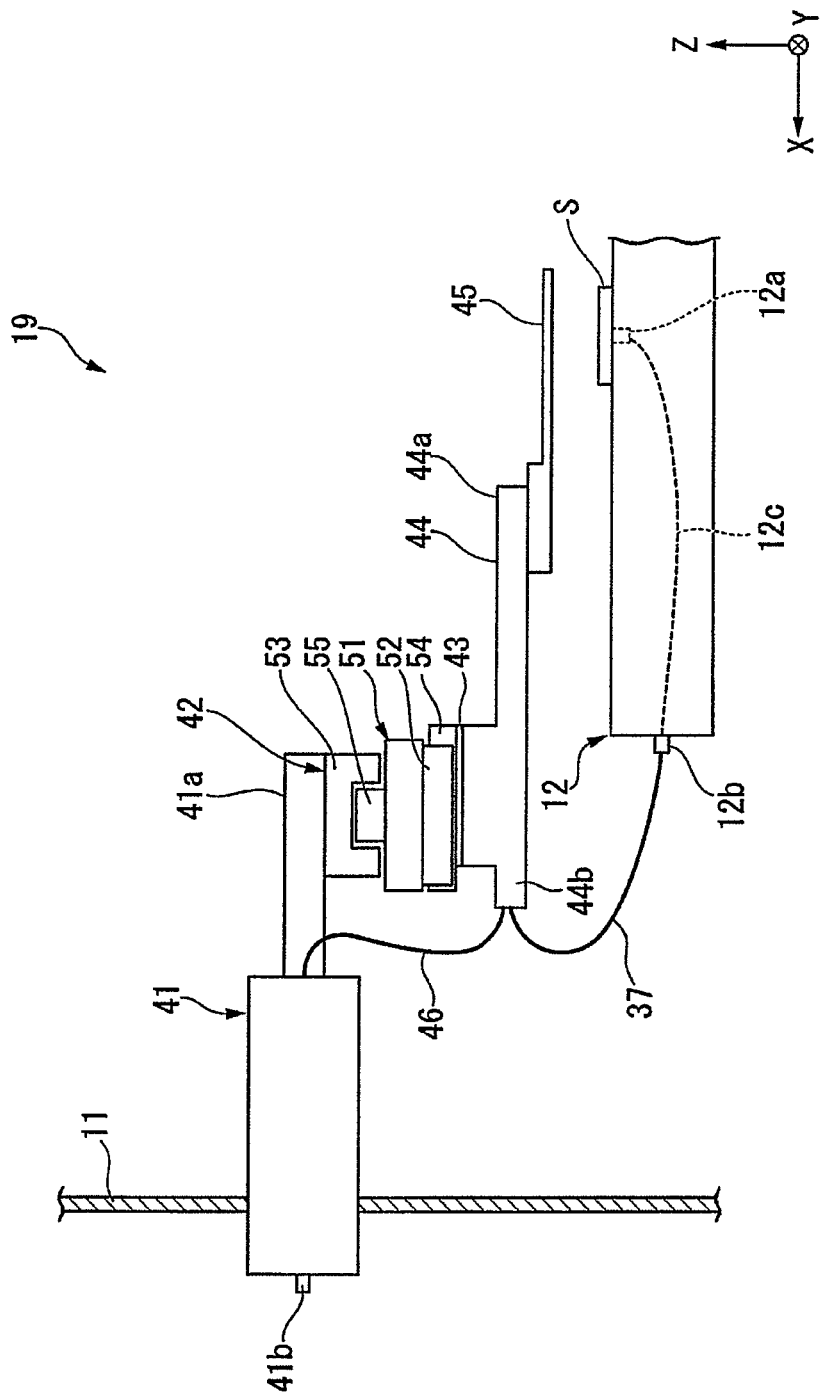
FIG. 4 is a side view illustrating schematic configurations of an electrode driving unit and a sample plate of a charged particle beam apparatus according to an embodiment of the present invention.

FIG. 1 is a perspective view illustrating schematic configurations of a charged particle beam apparatus 10 according to an embodiment of the present invention. FIG. 2 is a side view illustrating schematic configurations of a part of a charged particle beam apparatus 10 according to an embodiment of the present invention. FIG. 3 is an enlarged perspective view illustrating an electrode driving unit 19 of a charged particle beam apparatus 10 according to an embodiment of the present invention. FIG. 4 is a side view illustrating schematic configurations of an electrode driving unit 19 and a sample plate 12 of a charged particle beam apparatus 10 according to an embodiment of the present invention.

The charged particle beam apparatus 10 according to an embodiment of the present invention includes: a sample chamber 11 where internal pressure is maintained at a reduced state; a sample plate 12 fixing a sample S in the sample chamber 11; an electron beam column 13 fixed in the sample chamber 11; and a focused ion beam column 14. The charged particle beam apparatus 10 includes a detector fixed in the sample chamber 11, e.g., a secondary charged particle detector 15 and an EDS detector 16. The charged particle beam apparatus 10 includes: a gas supply unit 17 supplying gas on a surface of the sample S; and a needle 18 transferring a micro sample piece (not shown) from the sample S fixed on the sample plate 12 to a sample piece holder (not shown). The charged particle beam apparatus 10 includes: an electrode driving unit 19 for a beam emitting end portion 13a of the electron beam column 13 and the sample S; and a power source 20. The charged particle beam apparatus 10 includes, outside the sample chamber 11: a control device 21 controlling overall operation of the charged particle beam apparatus 10; an input device connected to the control device 21; and a display device 23.

Also, hereinafter, an X-axis, a Y-axis, and a Z-axis define a three-dimensional rectangular coordinate system. The X-axis and the Y-axis are parallel to a reference place (e.g., a horizontal plane, etc.) perpendicular to an upward-downward direction of the charged particle beam apparatus 10, and the Z-axis is parallel to the upward-downward direction (e.g., a vertical direction perpendicular to a horizontal plane, etc.).

Also, an irradiation target of the electron beam column 13 and the focused ion beam column 14 is not limited to the sample S, and may be the sample piece, the sample piece holder, and the needle 18 existing in an irradiation region, etc.

The sample chamber 11 is an internal pressure housing having an airtight structure where internal pressure may be maintained at a desired reduced state. In the sample chamber 11, exhausting is performed by an exhaust device (not shown) until internal pressure reaches a desired reduced state.

The sample plate 12 includes: a sample stage 31 on which the sample S is placed; a first rotating unit 32 rotating the sample stage 31 around a rotating shaft parallel to the Z-axis; and a first supporting part 33 supporting the sample stage 31 and the first rotating unit 32. The sample plate 12 includes: a stage moving unit 34 moving the first supporting part 33 parallel to the X-axis, the Y-axis, and the Z-axis; and a second supporting part 35 supporting the first supporting part 33 and the stage moving unit 34. The sample plate 12 includes a second rotating unit 36 rotating the second supporting part 35 around a tilt shaft T parallel to the X-axis. The second rotating unit 36 is fixed in the sample chamber 11. The second rotating unit 36 enables the sample stage 31 to be tilted at an arbitrary angle with respect to the Y-axis. The first rotating unit 32, the stage moving unit 34, and the second rotating unit 36 are separately controlled by a control signal output from the control device 21 depending on an operation mode of the charged particle beam apparatus 10, etc.

The sample plate 12 includes a first end 12a electrically connected to the irradiation target fixed on the sample stage 31. The first end 12a is, for example, in contact with a surface of the irradiation target fixed on the sample stage 31 for an electrical connection. The sample plate 12 includes: a second end 12b provided at a position spaced apart from the irradiation target fixed on the sample stage 31; and a wire 12c electrically connecting the first end 12a and the second end 12b. The second end 12b of the sample plate 12 is, for example, electrically connected to an electrode member 45 by an electrical connection member 37, such as a cable, etc.

The electron beam column 13 irradiates, with an electron beam EB, the irradiation target within a predetermined irradiation region inside the sample chamber 11. The electron beam column 13 enables, for example, a beam emitting end portion 13a for the electron beam to face the sample stage 31 in a Z-axis direction, enables an optical axis of the electron beam to be parallel to the Z-axis direction, and is fixed in the sample chamber 11. The electron beam column 13 includes: an electron source generating electrons; and electron optics focusing and deflecting electrons emitted from the electron source. The electron optics includes, for example, an electron lens, a deflector, etc. The electron source and the electron optics are controlled by the control signal output from the control device 21 depending on an irradiation position and an irradiation condition of the electron beam, etc.

The focused ion beam column 14 irradiates, with a focused ion beam FIB, the irradiation target within the predetermined irradiation region inside the sample chamber 11. The focused ion beam column 14 enables, for example, a beam emitting end portion 14a for the focused ion beam to face the sample stage 31 in a tilt direction tilted at a predetermined angle with respect to the Z-axis, enables an optical axis of the focused ion beam to be parallel to the tilt direction, and is fixed in the sample chamber 11. The focused ion beam column 14 includes: an ion source generating ions; and ion optics focusing and deflecting ions drawn out of the ion source. The ion optics includes, for example, a first electrostatic lens, such as a condenser lens, etc., an electrostatic deflector, and a second electrostatic lens, such as an objective lens, etc. The ion source and the ion optics are controlled by the control signal output from the control device 21 depending on the irradiation position and the irradiation condition of the focused ion beam, etc. The ion source is, for example, a liquid metal ion source using liquid gallium, etc, a plasma ion source, a gas field ion source, etc.

The charged particle beam apparatus 10 emits the focused ion beam to scan and irradiate the surface of the irradiation target, such that imaging of an irradiated part, various processing (excavating, trimming processing, etc.) by sputtering, forming of a deposition film, etc. can be performed. The charged particle beam apparatus 10 can perform processing of forming a sample piece (e.g., a thin sample slice, a needle-shaped sample, etc.) for transmission-observation from the sample S by a transmission electron microscope and a sample piece for analysis by the electron beam. The charged particle beam apparatus 10 can perform processing of the sample piece transferred to the sample piece holder into a thin film for desired thickness suitable for transmission-observation by the transmission electron microscope. The charged particle beam apparatus 10 emits the focused ion beam or the electron beam to scan and irradiate the surface of the irradiation target, such as the sample S, the sample piece, the needle 18, etc., whereby observation of the surface of the irradiation target can be performed.

Also, to change the positions of the electron beam column 13 and the focused ion beam column 14, the electron beam column 13 may be provided in the tilt direction and the focused ion beam column 14 may be provided in the Z-axis direction.

The secondary charged particle detector 15 detects a secondary charged particle (a secondary electron, and a secondary ion) generated from the irradiation target due to irradiation with the focused ion beam or the electron beam. The EDS detector 16 detects an X-ray generated from the irradiation target due to irradiation with the electron beam. The secondary charged particle detector 15 and the EDS detector 16 separately access the control device 21, and detection signals output from the secondary charged particle detector 15 and the EDS detector 16 are transmitted to the control device 21.

Without being limited to the secondary charged particle detector 15 and the EDS detector 16, the charged particle beam apparatus 10 may include another detector. As another detector, for example, there are a back-scattered electron detector, an EBSD detector, etc. The back-scattered electron detector detects back-scattered electrons back-scattered from the irradiation target due to irradiation with the electron beam. The EBSD detector detects an electron beam backscattered diffraction pattern generated from the irradiation target due to irradiation with the electron beam. Also, in the secondary charged particle detector 15, the secondary electron detector detecting the secondary electron and the backscattered electron detector may be provided in a housing of the electron beam column 13.

The gas supply unit 17 is fixed in the sample chamber 11. The gas supply unit 17 includes a gas spray part (nozzle) provided to face the sample stage 31. The gas supply unit 17 supplies etching gas, deposition gas, etc. to the irradiation target. The etching gas is used to stimulate etching of the irradiation target by the focused ion beam selectively depending on the material of the irradiation target. The deposition gas is used to form the deposition film on the surface of the irradiation target by a deposit, such as metal, an insulator, etc.

The needle 18 is, for example, displaced within the sample chamber 11 by a needle driving unit 18a provided independently of the sample plate 12. The needle 18 extracts a micro sample piece from the sample S fixed on the sample plate 12, and holds and transfers the sample piece to the sample piece holder.

The gas supply unit 17 and the needle driving unit 18a are separately controlled by the control signal output from the control device 21 depending on the operation mode of the charged particle beam apparatus 10, etc.

The electrode driving unit 19 includes a first supporting member 41, a driving unit 42, an insulation member 43, a second supporting member 44, and an electrode member 45.

The first supporting member 41 is fixed in the sample chamber 11. The first supporting member 41 is, for example, provided in the shape of a rod extending in the X-axis direction. A front end portion 41a in the X-axis direction of the first supporting member 41 supports the driving unit 42 inside the sample chamber 11. The first supporting member 41 holds a cable 46 therein, the cable being electrically connected to an end 41b provided outside the sample chamber 11.

The driving unit 42 includes an actuator driving in at least one arbitrary axis direction within a place intersecting an optical axis of the electron beam column 13, for example, a two-axis actuator 51 driving in the X-axis direction and the Y-axis direction. The actuator 51 is, for example, a piezoelectric actuator. The actuator 51 includes: a first guide rail 52 and a second guide rail 53 extending in the X-axis direction and the Y-axis direction respectively; and a first slider 54 and a second slider 55 moving along the first guide rail 52 and the second guide rail 53 respectively. Also, the actuator 51 may preferably include a unit driving in a shift direction (e.g., the Z-axis direction) parallel to the optical axis of the electron beam column 13. The actuator 51 is controlled by the control signal output from the control device 21 depending on the operation mode of the charged particle beam apparatus 10, etc.

The insulation member 43 is provided between the driving unit 42 and a second supporting member 44. The insulation member 43 is, for example, provided in the shape of a plate. The insulation member 43 is, for example, formed by a material having high electrical insulation and thermal insulation, such as resin, ceramics, etc. The insulation member 43 electrically and thermally insulates the driving unit 42 and the sample chamber 11 from the second supporting member 44 and the electrode member 45.

The second supporting member 44 is fixed to the driving unit 42 by the insulation member 43. The second supporting member 44 is, for example, provided in the shape of a plate extending in the X-axis direction. The second supporting member 44 is, for example, formed by a conductive material, such as a resin material with a conductive surface coating, a non-magnetic metal material, etc. In the second supporting member 44 in the X-axis direction, a first end portion 44a close to the electron beam column 13 supports the electrode member 45. In the second supporting member 44 in the X-axis direction, a second end portion 44b distant from the electron beam column 13 is electrically connected to the electrical connection member 37 and the cable 46. Thus, the second supporting member 44 is electrically connected to the end 41b provided outside the sample chamber 11 and to the second end 12b of the sample plate 12. The electrical connection member 37 and the cable 46 are provided so as not to interfere with driving of the second supporting member 44 and the electrode member 45 by the driving unit 42.

The second supporting member 44 is provided at a position distant from a space between the beam emitting end portion 13a of the electron beam column 13 and the sample stage 31 so as not to interfere with the electron beam from the electron beam column 13 irradiating the irradiation target, even when the second supporting member is displaced by the driving unit 42 in the X-axis direction or the Y-axis direction.

Figure 5:
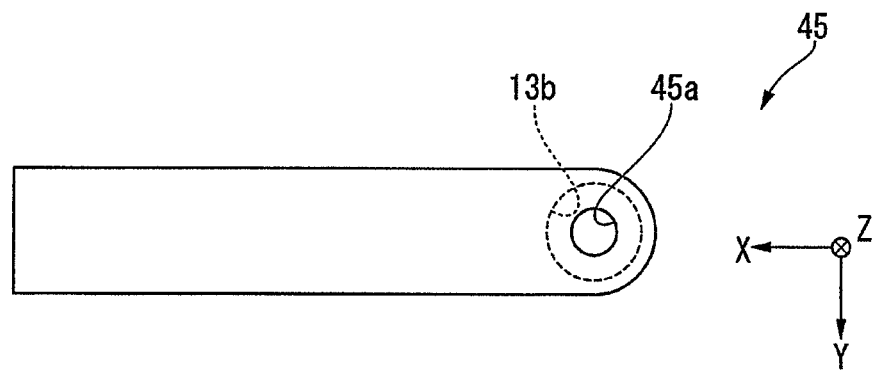
FIG. 5 is a plan view illustrating an electrode member of a charged particle beam apparatus according to an embodiment of the present invention viewed from a sample stage, and illustrating a state where an electrode penetrating hole is placed at an insertion position.
Figure 6:
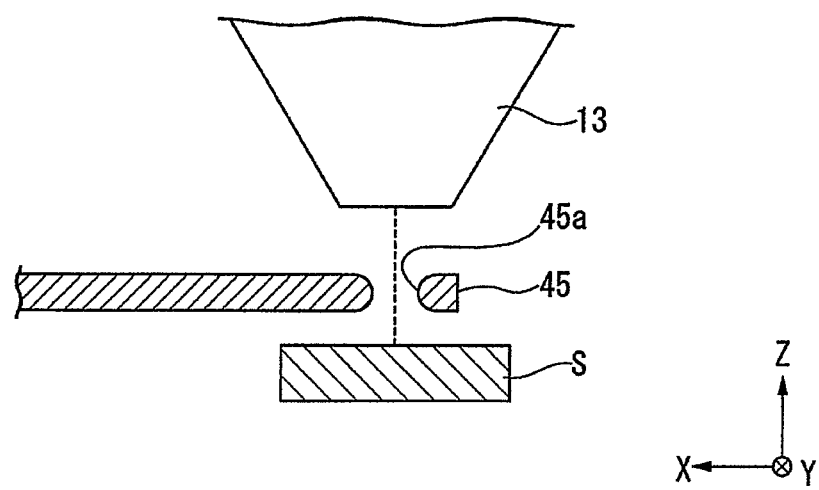
FIG. 6 is a cross-sectional view illustrating an electrode member of a charged particle beam apparatus according to an embodiment of the present invention.

FIG. 5 is a plan view illustrating an electrode member 45 of a charged particle beam apparatus 10 according to an embodiment of the present invention viewed from a sample stage 31, and illustrating a state where an electrode penetrating hole 45a is placed at an insertion position. FIG. 6 is a cross-sectional view illustrating an electrode member 45 of a charged particle beam apparatus 10 according to an embodiment of the present invention.

The electrode member 45 is fixed in the second supporting member 44. The electrode member 45 is, for example, provided in the shape of a plate extending in the X-axis direction. The electrode member 45 is, for example, formed by a non-magnetic metal material, such as Titan, etc. or by a non-magnetic material having conductivity, such as a resin material having a conductive surface coating, etc.

The electrode member 45 is provided to be displaced between an insertion position between the beam emitting end portion 13a of the electron beam column 13 and the sample stage 31 and a withdrawal position distant from the insertion position. The insertion position is, for example, a position on the optical axis of electron beam, such as a position facing an opening 13b formed in the beam emitting end portion 13a of the electron beam column 13 in the Z-axis direction, etc. The withdrawal position is, for example, a position that does not interfere with irradiation by the electron beam from the electron beam column 13 to the irradiation target, such as a position moved out of the position on the optical axis of the electron beam in the X-axis direction, etc. The electrode member 45 is, for example, provided in the shape of a plate extending in the X-axis direction. In the X-axis direction of the electrode member 45, a front end portion closer to the electron beam column 13 is provided with an electrode penetrating hole 45a through which the electron beam from the electron beam column 13 irradiating the irradiation target penetrates. For example, the diameter of the opening 13b of the beam emitting end portion 13a is about several mm, but the diameter of the electrode penetrating hole 45a is about half of the diameter of the opening 13b such that the size of the electrode penetrating hole 45a is provided so as not to interfere with the electron beam from the electron beam column 13 irradiating the irradiation target. The inner surface of the electrode penetrating hole 45a is provided in the shape of a convex curved surface smoothly that is continuous to the surface of the electrode member 45. The electrode penetrating hole 45a is, for example, displaced between the insertion position and the withdrawal position depending on driving of the electrode member 45 in the X-axis direction by the driving unit 42.

The electrode member 45 is electrically connected to the irradiation target on the sample plate 12 via the second supporting member 44, the electrical connection member 37, the wire 12c, etc. Also, the electrode member 45 may be electrically connected to the irradiation target on the sample plate 12 as being directly in contact therewith.

The power source 20 is electrically connected to the end 41b outside the sample chamber 11, and is electrically connected to the electrode member 45 via the cable 46 and the second supporting member 44. The power source 20 is electrically connected to the irradiation target on the sample plate 12 via the cable 46, the electrical connection member 37, the wire 12c, etc. In a state where the electrode penetrating hole 45a of the electrode member 45 is placed at the insertion position, the power source 20 applies a negative voltage to the electrode member 45 and the irradiation target such that the electrode member 45 and the irradiation target have the same electric potential.

The control device 21 controls overall operation of the charged particle beam apparatus 10 by a signal output from the input device 22, a signal generated by preset automatic operation control processing, etc. The input device 22 includes a mouse, a keyboard, etc. that output a signal in consequence of input operation of an operator.

The control device 21 enables a display device 23 to display a screen for performing various settings such as mode selection, processing setting, etc. in automatic sequence control. The control device 21 enables the display device 23 to display image data generated based on a state quantity detected by various detectors, such as the secondary charged particle detector 15, the EDS detector 16, etc. in addition to an operation screen for the image data. The control device 21 enables, for example, the electron beam or the focused ion beam to scan the irradiation position, and converts a detected amount of secondary charged particles detected by the secondary charged particle detector 15 to a luminance signal corresponding to the irradiation position, thereby generating the image data representing the form of the irradiation target by two-dimensional position distribution of the detected amount of secondary charged particles. The control device 21 enables the display device 23 to display the generated image data in addition to a screen for executing operations, such as zoom-in, zoom-out, shift, rotation, etc. of each image data.

As described above, according to the charged particle beam apparatus 10 of the embodiment, the electrode member 45 is displaced between the insertion position and the withdrawal position by driving of the driving unit 42, and receives the negative voltage to decelerate the electron beam to the irradiation target, whereby appropriate and high-accuracy alignment of the electrode member 45 and the irradiation target can be easily performed.

The driving unit 42 includes the actuator 51 displacing the electrode member 45 in a shift direction parallel to the tilt shaft T of the sample stage 31, and thus it is possible to inhibit driving of the electrode member 45 from interfering with rotation of the sample plate 12 around the tilt shaft T.

The driving unit 42 includes the actuator 51 displacing the electrode member 45 in the Y-axis direction perpendicular to the tilt shaft T of the sample stage 31, and thus withdrawal from the insertion position can be quickly performed so as not to interfere with irradiation from the electron beam to the irradiation target and observation on the secondary electron generated from the irradiation target.

The driving unit 42 includes the actuator 51 displacing the electrode member 45 in a shift direction parallel to the optical axis of the electron beam column 13, and thus appropriate and high-accuracy alignment of the electrode member 45 and the irradiation target can be easily performed.

The inner surface of the electrode penetrating hole 45*a* is provided in the shape of a convex smoothly that is continuous to the surface of the electrode member 45 such that an appropriate electric field for decelerating the electron beam can be generated around the irradiation target.

The power source 20 applies a negative voltage to the electrode member 45 and the irradiation target such that the electrode member 45 and the irradiation target have the same electric potential, and thus the appropriate electric field for decelerating the electron beam can be generated stably around the irradiation target.

The electrode member 45 and the irradiation target are electrically connected to each other indirectly via the second supporting member 44, the electrical connection member 37, the wire 12*c*, etc. Thus, compared to the case where the electrode member 45 and the irradiation target are directly in contact with each other, damage of the irradiation target (e.g., a defect of a conductive film, etc.) can be prevented.

Hereinafter, a modification of the above-described embodiment will be described with reference to the accompanying drawings.

Figure 7:
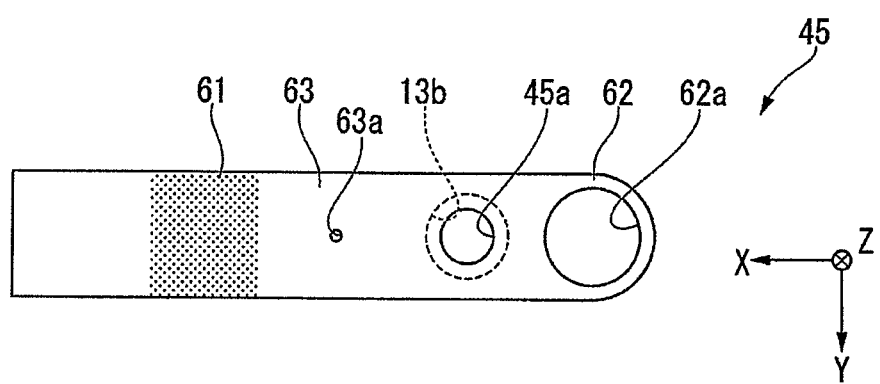
FIG. 7 is a plan view illustrating an electrode member of a charged particle beam apparatus according to a modification of the embodiment of the present invention viewed from a sample stage, and illustrating a state where an electrode penetrating hole is placed at an insertion position.

FIG. 7 is a plan view illustrating an electrode member 45 of a charged particle beam apparatus 10 according to a first modification of the embodiment of the present invention viewed from a sample stage 31, and illustrating a state where an electrode penetrating hole 45*a* is placed at an insertion position.

In the above-described embodiment, the electrode member 45 may include the electrode penetrating hole 45*a* for retarding and a part having a difference function. According to the modification, the electrode member 45 includes, for example, an opening and closing part 61, a contact part 62, and an aperture part 63.

The opening and closing part 61 is, for example, in the X-axis direction of the electrode member 45, and is provided on an end portion distant from the electron beam column 13. The opening and closing part 61 is provided to be displaced between the insertion position between the beam emitting end portion 13*a* of the electron beam column 13 and the sample stage 31 and the withdrawal position distant from the insertion position. The insertion position is, for example, a position where the opening and closing part 61 blocks the opening of the beam emitting end portion 13*a*, such as a position right in front of the opening 13*b* formed on the beam emitting end portion 13*a* of the electron beam column 13 in the Z-axis direction, etc. The withdrawal position is, for example, a position where the opening and closing part 61 unblocks the opening 13*b* of the beam emitting end portion 13*a*, such as a position moved from the position right in front of the opening 13*b* of the beam emitting end portion 13*a* in the Z-axis direction to the X-axis direction, etc. The opening and closing part 61 is, for example, displaced between the insertion position and the withdrawal position depending on operation of the electrode member 45 in the X-axis direction by the driving unit 42.

The opening and closing part 61 is, for example, placed at the insertion position due to operation of the electrode member 45 by the driving unit 42, when the irradiation target is irradiated by the focused ion beam from the focused ion beam column 14. Thus, the opening and closing part 61 is placed to block the opening 13*b* of the beam emitting end portion 13*a* of the electron beam column 13. For example, occurrence of internal pollution, which floating particles generated from the irradiation target, such as sputter particles, gas, etc., invade into the electron beam column 13 and adhere to the objective lens, etc., is prevented.

The opening and closing part 61 is, for example, placed at the withdrawal position due to operation of the electrode member 45 by the driving unit 42 after irradiation of the irradiation target by the focused ion beam, when the irradiation target is irradiated by the electron beam from the electron beam column 13. Thus, the opening and closing part 61 is placed to open the opening 13*b* of the beam emitting end portion 13*a*. For example, the opening and closing part is placed so as not to interfere with irradiation of the irradiation target by the electron beam from electron beam column 13 and observation of the secondary electron generated from the irradiation target by the secondary charged particle detector 15.

The contact part 62 is provided at a contact position capable of contacting the irradiation target before the beam emitting end portion 13*a* of the electron beam column 13 during operation of the sample stage 31. The contact position is, for example, a position, which is closer to the beam emitting end portion 13*a*, between the beam emitting end portion 13*a* and the sample stage 31 without interfering with the electron beam from the electron beam column 13 irradiating the irradiation target, such as the vicinity of the position right in front of the beam emitting end portion 13*a* of the electron beam column 13 in the Z-axis direction. The contact part 62 in the X-axis direction of the electrode member 45 is provided at a front end portion close to the electron beam column 13. The contact part 62 is, for example, provided in the shape of a ring plate, and the contact part 62 is provided with a penetrating hole 62*a* passing the electron beam from the electron beam column 13 therethrough to irradiate the irradiation target. The size of the penetrating hole 62*a* is, for example, larger than that of the beam emitting end portion 13*a* of the electron beam column 13 so as not to interfere with the electron beam from the electron beam column 13 irradiating the irradiation target.

The electrode member 45 is electrically connected to the end 41*b* outside the sample chamber 11 via the second supporting member 44 and the cable 46. Thus, change in electrical characteristics depending on whether the contact part 62 is in contact with the irradiation target is detected by a conduction sensor connected to the end 41*b* outside the sample chamber 11. Also, when detecting whether the contact part 62 is in contact with the irradiation target, electrical connection between the electrode member 45 and the irradiation target on the sample plate 12 via the electrical connection member 37, the wire 12*c*, etc. is blocked, and the irradiation target on the sample plate 12 is electrically connected to the sample chamber 11.

The aperture part 63 is provided, for example, to narrow the electron beam from the electron beam column 13 irradiating the irradiation target. The aperture part 63 is, for example, provided between the opening and closing part 61 and the electrode penetrating hole 45*a*. The aperture part 63 is provided with a micro aperture penetrating hole 63*a* passing a part of the electron beam from the electron beam column 13 irradiating the irradiation target. The size of the aperture penetrating hole 63a is, for example, about several μm to several μm in diameter, but the opening 13b of the beam emitting end portion 13a is about several mm in diameter.

According to the modification, the electrode member 45 is, for example, provided to displace the opening and closing part 61, the contact part 62, and the aperture part 63 between the insertion position and a position distant from the insertion position depending on operation of the electrode member 45 in the X-axis direction by the driving unit 42.

The electrode member 45 having the aperture part 63 is, for example, used when the electron beam column 13 composes an electron microscope, such as a scanning electron microscope, a transmission electron microscope, etc. and phase recovery processing is executed. The aperture part 63 is used as a limited visual field aperture in so-called limited visual field diffraction. In the case where the irradiation target irradiated by the electron beam from the electron beam column 13 to detect the secondary electron or the transmission electron from the irradiation target, the aperture part 63 is placed at the insertion position when observing an electron diffraction image, and is placed at a position distant from the insertion position when observing an actual image. When the aperture part 63 is, for example, placed at the position distant from the insertion position during observation of the actual image, a relative position to the electrode penetrating hole 45a or to the contact part 62 is set to place the electrode penetrating hole 45a or the penetrating hole 62a of the contact part 62 at the insertion position.

The aperture part 63 placed at the insertion position, forms an observation region containing the irradiation target and an outer region of zero potential which is outside of the observation region as a constraint of an actual space image in phase recovery processing, whereby convergence of phase recovery processing may be enhanced. During observation of the electron diffraction image, the electron beam is widened by a lens and a desired visual field is selected by the aperture part 63 such that irradiation density of the electron beam is reduced with uniform intensity distribution, and resolution of the electron diffraction image may be increased.

Also, in phase recovery processing, first, Fourier transform is performed on the actual image of the actual space generated randomly to generate an electron diffraction image of an inverse space. Next, the amplitude of the generated electron diffraction image is substituted by the amplitude of an experimentally obtained electron diffraction image (inverse space), and the actual image (actual space) is reconstituted by inverse Fourier transform. In this way, Fourier transform and inverse Fourier transform are repeated such that phase information of the actual image is recovered.

Figure 8A:
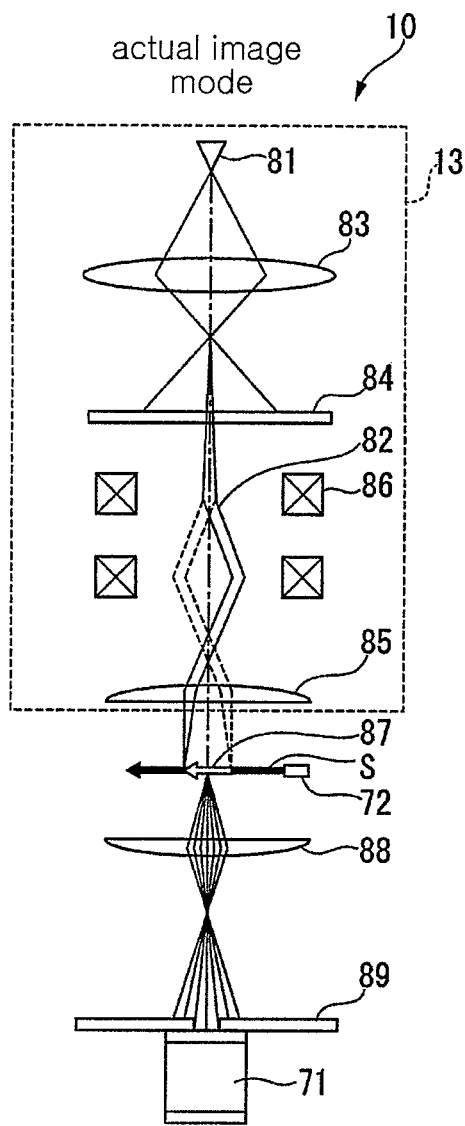
FIG. 8A is a view illustrating paths of electron beams in an actual image mode of a transmission electron microscope having an electron beam column as a charged particle beam apparatus according to a modification of the embodiment of the present invention.
Figure 8B:
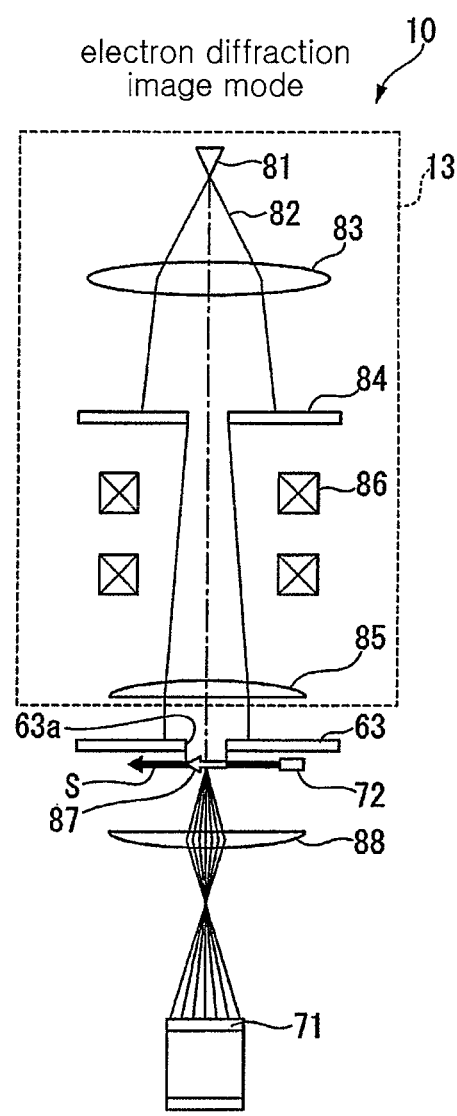
FIG. 8B is a view illustrating paths of electron beams in an electron diffraction image mode of a transmission electron microscope having an electron beam column as a charged particle beam apparatus according to a modification of the embodiment of the present invention.

Each of FIG. 8A and FIG. 8B is a view each illustrating paths of electron beams in an actual image mode and a view illustrating paths of electron beams in an electron diffraction image mode of a transmission electron microscope having an electron beam column 13 as the charged particle beam apparatus 10 according to a modification of the embodiment of the present invention.

According to the modification, the charged particle beam apparatus 10 includes: the electron beam column 13 composing at least a part of an imaging system for obtaining intensity distribution of the actual image and the electron diffraction image; a detector 71 detecting a transmission electron of the irradiation target caused by irradiation with the electron beam; and a sample holder 72 holding the irradiation target (the sample S, etc.) to enable the detector 71 to detect the transmission electron.

In the actual image mode, electron beams 82 emitted from an electron source 81 converge on an irradiation lens 83, are cut by a condenser aperture 84 only into a portion having a small irradiation angle, and converge on an objective lens 85 into fine electron beams 82 being sub-nm in diameter. The electron beams 82 scan by a scanning coil 86 and irradiate an irradiation region 87 being dozens nm in diameter in the sample S. Transmission electrons scattered by the irradiation region 87 and transmitted are detected over an objective lens 88 by the detector 71. A detection angle limiting aperture 89 placed right in front of the detector 71 sets a detection angle range of the transmission electrons detected by the detector 71.

In the electron diffraction image mode, electron beams 82 emitted from the electron source 81 are widened by the irradiation lens 83 and are cut by the condenser aperture 84 only into a portion having uniform brightness. The electron beams 82 passed through the condenser aperture 84 are parallel to each other by the objective lens 85. Here, scanning by the scanning coil 86 with the electron beams 82 is not performed. At the insertion position immediately above the sample S, the aperture penetrating hole 63a of the aperture part 63 is placed depending on operation of the electrode member 45 in the X-axis direction by the driving unit 42. The form of the aperture penetrating hole 63a is provided to be the same as the irradiation region 87 in the actual image mode. The electron beams 82 after being cut to the aperture part 63 irradiate the irradiation region 87 the same as in the actual image mode.

According to the modification, the aperture penetrating hole 63a of the aperture part 63 may enhance convergence of phase recovery processing. During observation of the electron diffraction image, irradiation density of the electron beam may be reduced with uniform intensity distribution, and resolution of the electron diffraction image may be increased.

The embodiments have been disclosed for illustrative purposes, and those skilled in the art will appreciate that various omissions, substitutions, and modifications are possible, without departing from the scope and spirit of the invention as disclosed in the accompanying claims. For example, in the above-described embodiments, the actuator 51 displacing the electrode member 45 in the shift direction parallel to the tilt shaft T prevents that driving of the electrode member 45 interferes with a tilt of the sample plate 12 around the tilt shaft T, but the actuator is not limited thereto. The actuator 51 may displace the electrode member 45 within a range that does not interfere with a tilt of the sample plate 12 around the tilt shaft T, even if the shift direction parallel to the tilt shaft T is not used.

What is claimed is:

1. A charged particle beam apparatus, comprising:
a sample stage on which a sample is placed;
a sample chamber receiving the sample stage therein;
a charged particle beam column irradiating the sample with a charged particle beam;
an electrode member provided to be displaceable between an insertion position, the insertion position being between a beam emitting end portion of the charged particle beam column and the sample stage, and a withdrawal position distant from the insertion position, the electrode member being provided with a penetrating hole through which the charged particle beam passes at the insertion position;
driving means displacing the electrode member;

a power source applying negative voltage to the electrode member from outside the sample chamber to decelerate the charged particle beam with respect to the sample; and an electrical insulation member electrically insulating the sample chamber and the driving means from the electrode member.

2. The apparatus of claim 1, wherein the driving means includes an actuator displacing the electrode member in a shift direction parallel to an optical axis of the charged particle beam column.

3. The apparatus of claim 1, wherein the driving means includes an actuator displacing the electrode member within a range that does not interfere with a tilt of the sample stage.

4. The apparatus of claim 1, wherein an inner surface of the penetrating hole is formed in a shape of a convex surface that is smoothly continuous to a surface of the electrode member.

5. The apparatus of claim 1, wherein the power source applies negative voltage to the electrode member and the sample such that the electrode member and the sample have a same electric potential.

6. The apparatus of claim 5, further comprising:
a first end being in contact with the sample;
a second end provided at a position distant from the sample; and
an electrical connection member electrically connecting the first end and the second end,
wherein the power source applies negative voltage to the second end and the electrode member.

7. The apparatus of claim 1, wherein the charged particle beam column includes an electron beam column irradiating the sample with an electron beam, and a focused ion beam column irradiating the sample with a focused ion beam.

* * * * *